(12) United States Patent
Lee (10) Patent No.: US 7,839,954 B1
(45) Date of Patent: Nov. 23, 2010

(54) PHASE ROTATION OF IQ ORIGIN

(75) Inventor: Wayne S. Lee, San Mateo, CA (US)

(73) Assignee: Panasonic Corporation, Osaka (JP)

( * ) Notice: Subject to any disclaimer, the term of this patent is extended or adjusted under 35 U.S.C. 154(b) by 772 days.

(21) Appl. No.: 11/820,589

(22) Filed: Jun. 19, 2007

(51) Int. Cl.
*H03C 3/00* (2006.01)

(52) U.S. Cl. .................. 375/302; 375/295; 375/296; 375/300

(58) Field of Classification Search ............ 375/295, 375/296, 300
See application file for complete search history.

(56) References Cited

U.S. PATENT DOCUMENTS

| | | | | |
|---|---|---|---|---|
| 5,604,770 A | * | 2/1997 | Fetz | 375/296 |
| 5,990,738 A | * | 11/1999 | Wright et al. | 330/149 |
| 6,421,398 B1 | * | 7/2002 | McVey | 375/308 |
| 7,054,385 B2 | * | 5/2006 | Booth et al. | 375/300 |
| 7,126,999 B2 | * | 10/2006 | Dent | 375/261 |
| 2003/0012289 A1 | * | 1/2003 | Lindoff | 375/262 |
| 2008/0064343 A1 | * | 3/2008 | Lewis | 455/91 |

* cited by examiner

Primary Examiner—Shuwang Liu
Assistant Examiner—Kenneth Lam (57) ABSTRACT

Sampled IQ values at the origin are revalued by applying a minimum distance, or radius, away from the (0,0) coordinate in the IQ domain, and applying a rotation about the origin for consecutive (0,0) samples, thereby improving communication performance. A direction of rotation is able to be predetermined or dynamically determined according to a correction look-up table or an IQ trajectory.

21 Claims, 5 Drawing Sheets

PHASE ROTATION OF IQ ORIGIN

FIELD OF THE INVENTION

The present invention relates to modulating signals. More particularly, the present invention relates to adjusting sampled IQ values at the origin.

BACKGROUND OF THE INVENTION

An IQ modulator shapes and samples an input signal to generate a series of discrete sampled values. Each sampled value includes an in-phase (I) component and a quadrature (Q) component, collectively referred to as a sampled IQ value. An IQ trajectory is a path derived from discrete sampled IQ values sampled from the input signal. The sampled IQ values are plotted on an IQ graph, with the origin (0,0) defined as the zero value for both the in-phase (I) component and the quadrature (Q) component. The sampling rate determines the number of discrete sampled IQ values. The higher the sampling rate, the more points that define the IQ trajectory. The IQ trajectory is ideally a smooth curve representing an infinite number of discrete sampled IQ values. In practice, there is always some finite number of sampled values, as defined by the sampling rate.

By hardware limitations, an IQ trajectory through the origin generates distortion in a corresponding output signal. Corrective processing of the sampled IQ values at the origin can improve the performance of the signal processing circuit. When IQ values at the origin are processed through a filter and over-sampled many transients occur as consecutive IQ values at the origin are traversing about, around and through the origin. Processing of the IQ values is desirable to remove these transients.

SUMMARY OF THE INVENTION

Embodiments of a revaluation method are disclosed to revalue one or more consecutively sampled IQ values at the origin in order to maintain better continuity in the IQ trajectory. If a sampled IQ value is at the origin, that is the sampled IQ value has a zero value, the sampled IQ value is revalued such that the revalued sampled IQ values is at least a predetermined radius from the origin. For consecutive sampled IQ values that are at the origin, the first sampled IQ value at the origin is revalued to the revalued sampled IQ value, and each consecutive sampled IQ value at the origin is revalued by starting with the first revalued sampled IQ value and rotating by a determined number of degrees relative to the origin. In this manner, each of the consecutively revalued sampled IQ values have the same radius, and are progressively rotated about the origin. The degree of rotation is able to be predetermined or dynamically determined. The degree of each rotation is able to be the same for each revalued IQ sample, or the degree of rotation is able to vary between some or all of each revalued IQ sample. A direction of rotation is either predetermined according to the application, or the direction of rotation is dynamically determined according to the direction of rotation of the IQ trajectory preceding the consecutive sampled IQ value at the origin.

Moving zero-value sampled IQ values away from the origin, and selectively determining a direction of rotation of consecutive zero-value samples enables minimizing the phase deviations caused by power amplifier distortion, controlling the bandwidth of the amplitude signal and the phase signal, controlling the dynamic range of the amplitude signal and the phase signal, and shifting energy distribution within a communication band.

In one aspect, a method comprises sampling an input signal to generate a plurality of discrete sampled IQ values within an IQ domain, wherein each sampled IQ value includes an in-phase component and a quadrature component, for a first sampled IQ value at the origin, revaluing the first sampled IQ value to a first revalued sampled IQ value, wherein the first revalued sampled IQ value is a non-origin IQ value, for each consecutive sampled IQ value at the origin that immediately follows the first sampled IQ value, rotating the first revalued sampled IQ value about the origin, thereby forming a next revalued sampled IQ value such that each next revalued sampled IQ value is an immediately preceding revalued sample IQ value rotated about the origin and modulating each sampled IQ value not originally at the origin and each revalued sampled IQ value. In some embodiments, the non-origin IQ value is a predetermined value. In other embodiments, the non-origin IQ value is a randomly selected value at least a predetermined radius away from the origin. In some embodiments, degree of rotation used to form each next revalued sampled IQ value is a predetermined amount. In other embodiments, a degree of rotation used to form each next revalued sampled IQ value is 90 degrees. In still other embodiments, a degree of rotation used to form each next revalued sampled IQ value is a randomly selected amount. In some embodiments, a degree of rotation used to form each next revalued sampled IQ value is constant. In other embodiments, a degree of rotation used to form each next revalued sampled IQ value is independent for each revalued sampled IQ value. A direction of rotation used to form each next revalued sampled IQ value is a predetermined direction. In some embodiments, a direction of rotation used to form each next revalued sampled IQ value is clockwise, thereby distributing more energy to a low frequency side of a carrier band than to a high frequency side. In other embodiments, a direction of rotation used to form each next revalued sampled IQ value is counter-clockwise, thereby distributing more energy to a high frequency side of a carrier band than to a low frequency side. In some embodiments, a direction of rotation used to form each next revalued sampled IQ value is determined according to a correction look-up table that includes a set of correction values. In some embodiments, the correction look-up table defines correction values to compensate for non-linear circuit characteristics. In some embodiments, if the correction look-up table includes a negative value corresponding to the origin, then the direction of rotation is counter-clockwise. The counter-clockwise rotation generates a positive phase difference between consecutive revalued sampled IQ values. In some embodiments, if the correction look-up table includes a positive value corresponding to the origin, then the direction of rotation is clockwise. The counter-clockwise rotation generates a negative phase difference between consecutive revalued sampled IQ values. In some embodiments, a direction of rotation used to form each next revalued sampled IQ value is dynamically determined according to a direction of rotation of an IQ trajectory immediately preceding the consecutively sampled IQ values at the origin. The method further comprises generating an IQ trajectory according to each sampled IQ value not originally at the origin and each revalued sampled IQ value.

In another aspect, a machine comprises a revaluation module configured to receive a plurality of discrete sampled IQ values within an IQ domain, wherein for a first sampled IQ value at the origin the revaluation module is configured to revalue the first sampled IQ value to a first revalued sampled IQ value, the first revalued sampled IQ value is a non-origin IQ value, further wherein for each consecutive sampled IQ value at the origin that immediately follows the first sampled IQ value the revaluation module is configured to rotate the first revalued sampled IQ value about the origin, thereby forming a next revalued sampled IQ value such that each next revalued sampled IQ value is an immediately preceding revalued sample IQ value rotated about the origin and an IQ modulator coupled to the revaluation module and configured to modulate each sampled IQ value not originally at the origin and each revalued sampled IQ value, and to output a plurality of discrete sampled IQ values.

In yet another aspect, a machine comprises a receiver portion configured to receive radio frequency signals in a receive frequency band and a transmitter portion including a revaluation module, wherein the revaluation module is configured to receive a plurality of discrete sampled IQ values within an IQ domain, wherein for a first sampled IQ value at the origin the revaluation module is configured to revalue the first sampled IQ value to a first revalued sampled IQ value, the first revalued sampled IQ value is a non-origin IQ value, further wherein for each consecutive sampled IQ value at the origin that immediately follows the first sampled IQ value the revaluation module is configured to rotate the first revalued sampled IQ value about the origin, thereby forming a next revalued sampled IQ value such that each next revalued sampled IQ value is an immediately preceding revalued sample IQ value rotated about the origin.

BRIEF DESCRIPTION OF THE SEVERAL VIEWS OF THE DRAWINGS

The present invention is described relative to the several views of the drawings. Where appropriate and only where identical elements are disclosed and shown in more than one drawing, the same reference numeral will be used to represent such identical elements.

DETAILED DESCRIPTION

Embodiments of the present invention are directed to a revaluation method to re-value the origin for each sampled IQ point at the origin (0,0). Those of ordinary skill in the art will realize that the following detailed description of the present invention is illustrative only and is not intended to be in any way limiting. Other embodiments of the present invention will readily suggest themselves to such skilled persons having the benefit of this disclosure.

Reference will now be made in detail to implementations of the present invention as illustrated in the accompanying drawings. The same reference indicators will be used throughout the drawings and the following detailed description to refer to the same or like parts. In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Sampled IQ values at the origin are revalued by applying a minimum distance, or radius, away from the (0,0) coordinate in the IQ domain, and applying a rotation about the origin for consecutive (0,0) samples, thereby improving communication performance.

Figure 1:
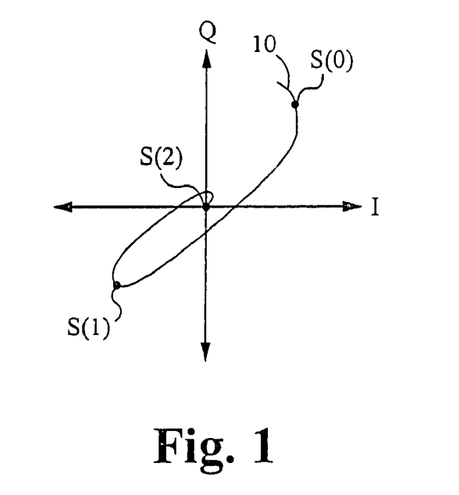
FIG. 1 illustrates an exemplary IQ trajectory including consecutive sampled IQ values.

FIG. 1 illustrates an exemplary IQ trajectory 10 including consecutive sampled IQ values denoted as sample point S(0), sample point S(1), and sample point S(2). For simplicity, the number of sample points shown relative to the IQ trajectory is significantly reduced. In general, the number of sample points is determined by the sampling rate. In this particular example, the sample point S(2) coincides with the origin. As described above, sampled IQ values at the origin result in undesired distortion in the corresponding output signal.

The revaluation method revalues each sampled IQ value coincident with the origin, herein referred to as a zero-value sampled IQ value. To revalue the zero-value sampled IQ value, the sample point is moved from the origin to a non-origin point within the IQ domain. The exact position of the non-origin point is application-specific, and can be predetermined for each application or dynamically determined according to real-time signal characteristics.

Figure 2:
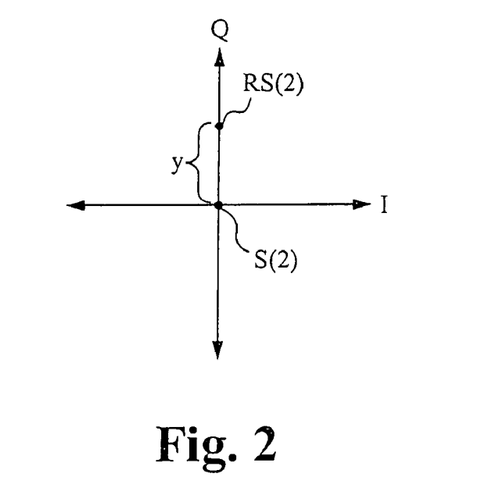
FIG. 2 illustrates an exemplary non-origin point to which a zero-value sampled IQ value is moved and revalued.
Figure 3:
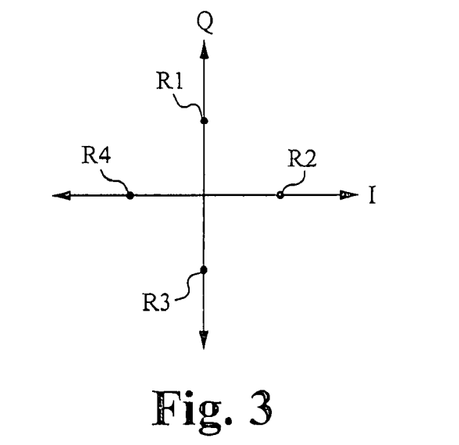
FIG. 3 illustrates alternative exemplary non-origin point to which a zero-value sampled IQ value is moved and revalued.

FIG. 2 illustrates an exemplary non-origin point to which a zero-value sampled IQ value is moved and revalued. In this example, the non-origin point is on the positive Q-axis and is a distance y from the origin. This revalued sample point is denoted as RS(2) and corresponds to the originally sampled IQ value at the sample point S(2). It is understood that the non-origin point to which the sample point S(2) is moved can alternatively be on the negative Q-axis, the positive I-axis, or the negative I-axis, as represented by the points R3, R2, and R4, respectively, in the FIG. 3. The non-origin points R1, R2, R3, and R4 shown in FIG. 3 are for exemplary purposes. It is understood that the non-origin point to which the zero-value sampled IQ value is moved can be any non-zero point in the IQ domain, and is not limited to the I-axis or the Q-axis as shown in FIG. 3.

At times, the IQ trajectory includes consecutive sampled IQ values that coincide with the origin. As described above, the first sampled IQ value at the origin, such as sample point S(2) in FIG. 1, is moved to a non-zero point, such as the revalued sample point RS(2) in FIG. 2. If a next sample point S(3) also coincides with the origin, the sample point S(3) is revalued, but not at the same revalued sampled point RS(2) as the immediately preceding sample point S(2). Instead, a revalued sample point RS(3) corresponding to the sample point S(3) is determined by starting from the previous revalued sample point, which in this case is the revalued sample point RS(2), and rotating about the origin by a determined degree of rotation. The direction of rotation, clockwise or counter-clockwise, is either predetermined or determined dynamically.

Figure 4:
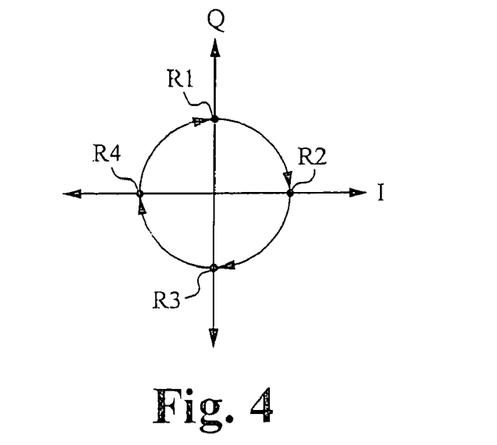
FIG. 4 illustrates an exemplary revaluing methodology for revaluing consecutive sampled IQ values at the origin.

FIG. 4 illustrates an exemplary revaluing methodology for revaluing consecutive sampled IQ values at the origin. In this case, the first revalued sampled point R1 is revalued along the positive Q-axis and consecutive zero-value sampled IQ values are rotated clockwise by 90 degrees. For example, the first revalued sample point R1 is located on the positive Q-axis, a second revalued sample point R2 is located on the positive I-axis, a third revalued sample point R3 is located on the negative Q-axis, and a fourth revalued sample point R4 is located on the negative I-axis. The revalued sample points R1, R2, R3, and R4 correspond to four consecutive sampled IQ values at the origin. If a fifth consecutive sampled IQ value coincides with the origin, the fifth zero-value sampled IQ value is revalued at the sample point R1. This revaluing process continues for each consecutive zero-value sampled IQ value until a sampled IQ value does not coincide with the origin. Once a sampled IQ value does not coincide with the origin, the revaluing process ends. If after the revaluing process ends a subsequent sampled IQ value coincides with the origin, the revaluing process starts anew.

Figure 5:
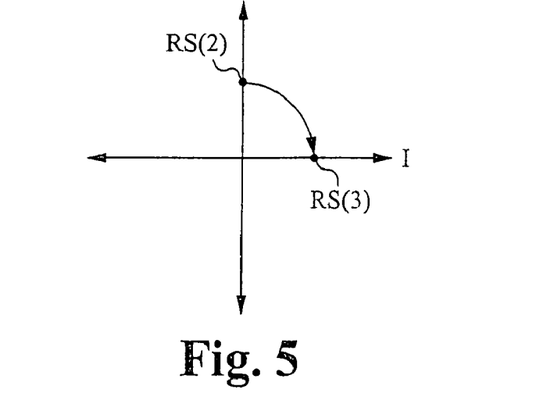
FIGS. 5 and 6 illustrate an exemplary application of the revaluing methodology shown in FIG. 4, as applied to three consecutive sampled IQ values at the origin.
Figure 6:
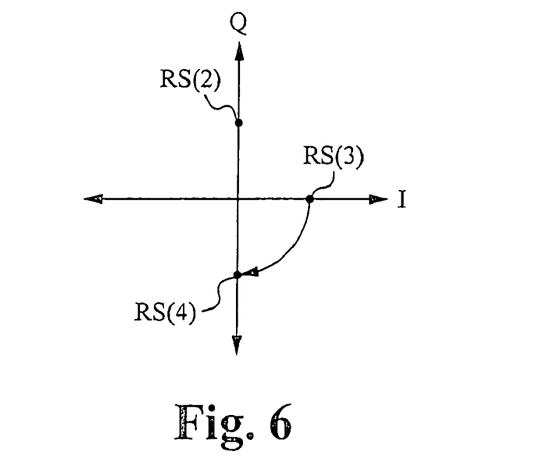

FIGS. 5 and 6 illustrate an exemplary application of the revaluing methodology shown in FIG. 4, as applied to three consecutive sampled IQ values at the origin. The first non-zero sampled IQ value corresponds to the sample point S(2) in FIG. 1. The first zero-value sampled IQ value is revalued at the sample point RS(2), which in this case is a non-zero value along the positive Q-axis. For a second consecutive zero-value sampled IQ value, where the second consecutive zero-value IQ value is the sample point immediately following the first zero-value sampled IQ value, the sample point is revalued at the revalued sample point RS(3), which in this case is the same non-zero value as the first revalued sample point R1, but rotated to the positive I-axis. For a third consecutive zero-value sampled IQ value, where the third zero-value IQ value is the sample point immediately following the second zero-value sampled IQ value, the sample point is revalued at the sample point RS(4), which in this case is the same non-zero value as the revalued sample point RS(3), but rotated to the negative Q-axis.

Figure 7:
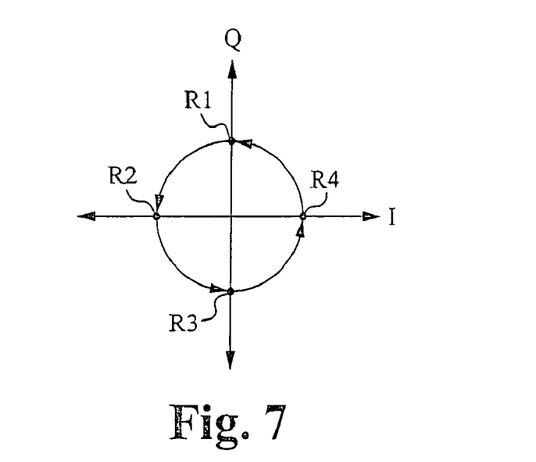
FIG. 7 illustrates an alternative revaluing methodology for revaluing consecutive sampled IQ values at the origin.

FIG. 7 illustrates an alternative revaluing methodology for revaluing consecutive sampled IQ values at the origin. In this case, the first revalued sampled point R1 is revalued along the positive Q-axis and consecutive zero-value sampled IQ values are rotated counter-clockwise by 90 degrees. The alternative revaluing methodology of FIG. 7 performs the same process as the revaluing methodology described in relation to FIG. 4 except that consecutively revalued sample points are determined by rotating in the counter-clockwise direction.

As shown in FIGS. 3-7, the magnitude of the rotation is a predetermined amount, and is the same for each consecutively revalued sample point. In other embodiments, the magnitude of the rotation can be varied for each consecutively revalued sample point.

Figure 8:
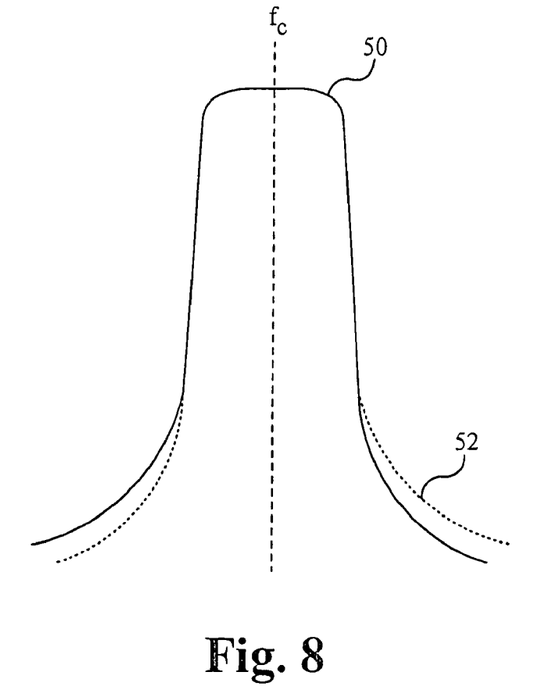
FIG. 8 illustrates the energy distribution effects of a counter-clockwise rotation.

Selectively determining the rotation direction is also used to control the energy distribution within a communication band spectrum. Applying a rotation in the revaluation method described above results in an imbalance in the energy distribution within the spectrum. In general, if a phase difference is negative, more energy is distributed to the low frequency side of the band. If the phase difference is positive, more energy is distributed to the high frequency side of the band. By applying a counter-clockwise rotation to consecutive revalued sample points, a positive phase difference is introduced, thereby distributing more energy to the high frequency side of the band. FIG. 8 illustrates the energy distribution effects of a counter-clockwise rotation. A band spectrum 50 represents the communication band with a center frequency fc, where no rotation of consecutive revalued sample points is applied. A shifted band spectrum 52 represents the band spectrum 50 after a counter-clockwise rotation is applied to the consecutive revalued sample points. Due to the counter-clockwise rotation, more energy is distributed into the high frequency side of the band spectrum 52, and less energy is distributed into the low frequency side.

Figure 9:
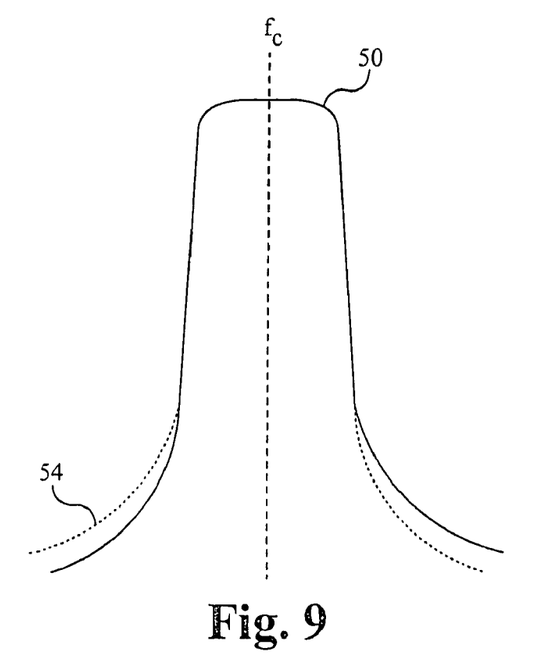
FIG. 9 illustrates the energy distribution effects of a clockwise rotation.

An opposite effect is introduced by applying a clockwise rotation to consecutive revalued sample points. By applying a clockwise rotation, a negative phase difference is introduced, thereby distributing more energy to the low frequency side of the band. FIG. 9 illustrates the energy distribution effects of a clockwise rotation. A shifted band spectrum 54 represents the band spectrum 50 after a clockwise rotation is applied to the consecutive revalued sample points. Due to the clockwise rotation, more energy is distributed into the low frequency side of the band spectrum 54, and less energy is distributed into the high frequency side.

In general, the band spectrum 50 represents a random energy distribution about the center frequency fc. By applying a rotation to consecutive revalued sample points, this randomness is manipulated so as to discretely distribute the energy within the band spectrum. One such application is to meet receive band noise specifications by selective rotation. The rotation direction is either predetermined or dynamically determined, depending on the specific application.

Figure 10:
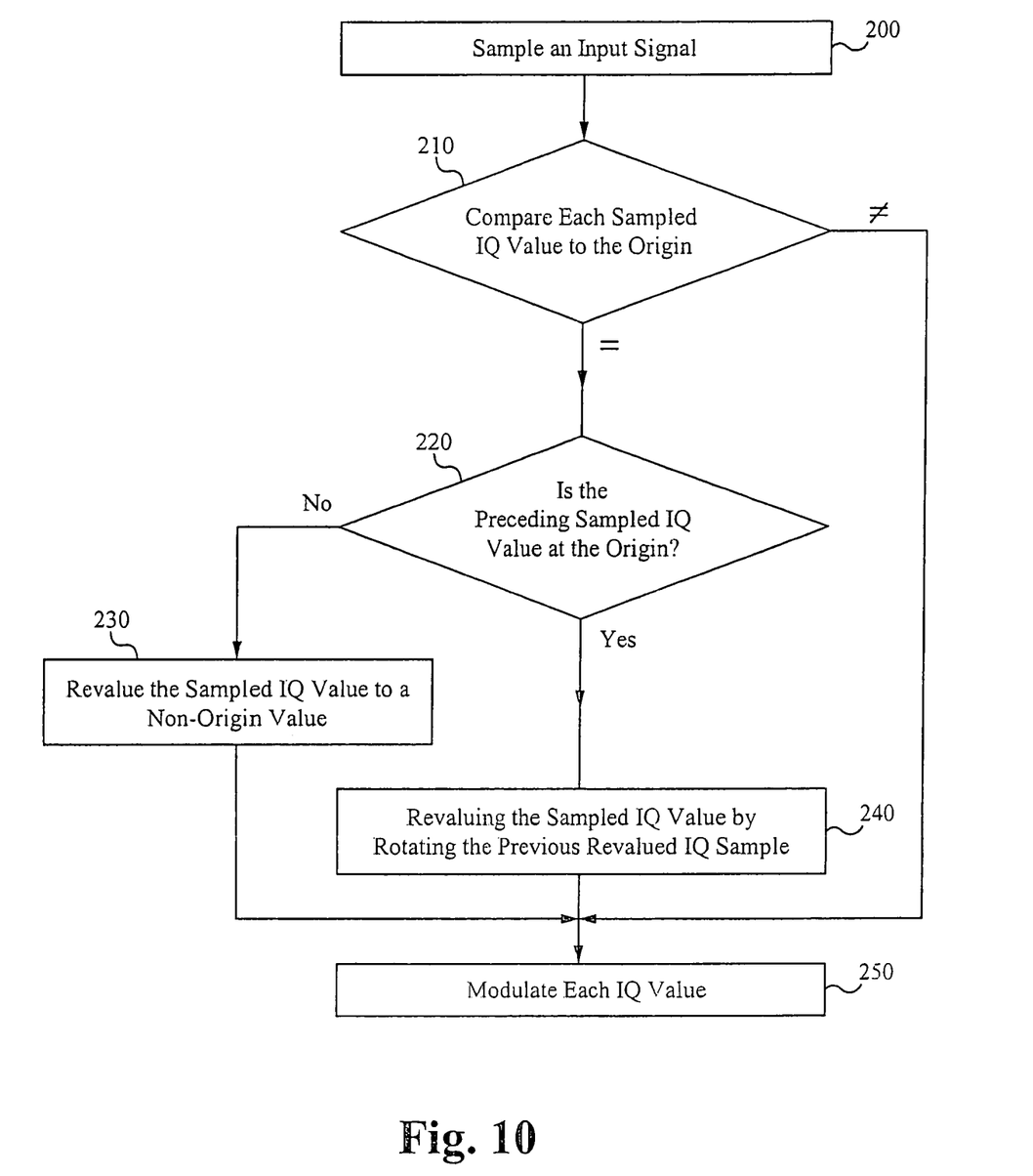
FIG. 10 illustrates the revaluation method for revaluing sampled IQ values at the origin.

FIG. 10 illustrates an exemplary revaluation method for revaluing sampled IQ values at the origin. At the step 200, an input signal is sampled to generate a series of discrete sampled IQ values. At the step 210, it is determined if each sampled IQ value is at the origin. If it is determined at the step 210 that the sampled IQ value is not at the origin, then the sampled IQ value is modulated at the step 250. If it is determined at the step 210 that the sampled IQ value is at the origin, then at the step 220 it is determined if the immediately preceding sampled IQ value was at the origin. If it is determined at the step 220 that the immediately preceding sampled IQ value was not at the origin, then at the step 230 the sampled IQ value is revalued to non-origin IQ value, thereby forming a first revalued sampled IQ value. The first revalued sampled IQ value is then modulated at the step 250.

If it is determined at the step 220 that the immediately preceding sampled IQ value was at the origin, then at the step 240 the sampled IQ value is revalued by rotating the previous revalued sampled IQ value. Each next revalued sampled IQ value is then modulated at the step 250. In this manner, for a consecutive series of sampled IQ values at the origin, a first sample at the origin is revalued to the first revalued sampled IQ value at the step 230, and each subsequent sampled IQ value in the series is revalued to a next revalued sampled IQ value at the step 240. Each next revalued sampled IQ value is determined by rotating the immediately preceding revalued sampled IQ value. For example, a second revalued sampled IQ value is determined by rotating the first revalued sampled IQ value, a third revalued sampled IQ value is determined by rotating the second revalued sampled IQ value, and so on for each consecutive sampled IQ value at the origin that is to be revalued.

Figure 11:
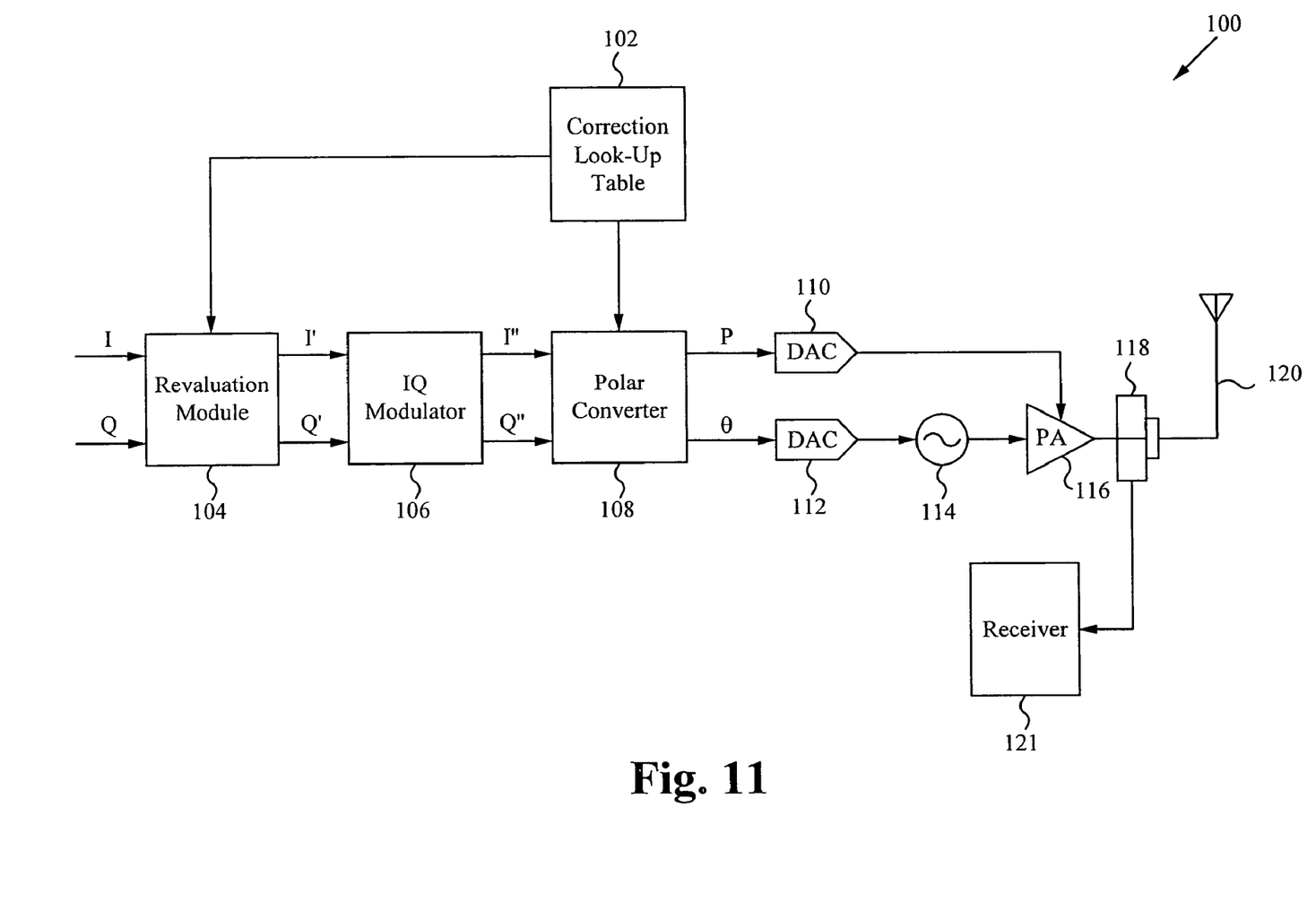
FIG. 11 illustrates a block diagram of an exemplary modulation circuit for implementing the revaluation method.

FIG. 11 illustrates a block diagram of an exemplary modulation circuit for implementing the revaluation method. The modulation circuit 100 includes a correction look-up table 102, a revaluation module 104, an IQ modulator 106, a polar converter 108, a digital-to-analog converter (DAC) 110, a DAC 112, a voltage controlled oscillator (VCO) 114, a power amplifier 116, a duplexer 118, and an antenna 120. The polar converter 108 converts an IQ signal to a corresponding digital amplitude signal and a digital phase signal. As part of the polar conversion process, the polar converter 108 utilizes a correction value provided by the correction look-up table 102. The correction value is used to correct for distortion generated by the power amplifier 116. The digital amplitude signal is converted to a corresponding analog amplitude signal by the DAC 110. The digital phase signal is converted to a corresponding analog phase signal by the DAC 112. The VCO 114 generates a frequency response according to the input analog phase signal. The frequency response output from the VCO 114 and the analog amplitude signal output from the DAC 110 are input to the power amplifier 116. The power amplifier 114 outputs an amplified signal, which is transmitted by the antenna 116 via the duplexer 118. In some embodiments, the amplified signal is a radio frequency (RF) signal. In some embodiments, as shown in FIG. 11, the duplexer 118 is able to be coupled to a receiving circuit 121 configured to process a signal received by the antenna 120.

Discrete sampled IQ values are input to the revaluation module 104. The revaluation module 104 revalues each sampled IQ value at the origin according to the revaluation method described above, thereby generating a revalued sample IQ value for each input sample IQ value at the origin. For each sample IQ value that is not at the origin, the sampled IQ value is essentially passed through and output from the revaluation module 104. Each passed through sampled IQ value and each revalued sample IQ value are input to the IQ modulator 106, where further modulation is applied. Modulated IQ values are output from the IQ modulator 106 and input to the polar converter 108.

As previously described, the revaluation method revalues consecutive zero-value sample points by moving the first zero-value sample point to some first non-origin point within the IQ domain, and by rotating subsequent consecutive zero-value sample points from the first non-origin point. The revaluation module 104 determines the direction of rotation, either clockwise or counter-clockwise. In some embodiments, the revaluation module 104 determines the rotation direction according to the correction values stored in the correction look-up table 102. The correction look-up table 102 maintains a table of correction values, one correction value corresponding to each radius, or amplitude, away from the origin. This includes a correction value corresponding to a zero radius, which is the origin. If the correction value at the origin is a negative value, then the revaluation module 104 determines that the direction of rotation is counter-clockwise. If the correction value at the origin is a positive value, then the revaluation module 104 determines that the direction of rotation is clockwise.

In other embodiments, the revaluation module 104 does not use the correction look-up table 102 to determine the direction of rotation. In some embodiments, the direction of rotation is predetermined, in which case the revaluation module 104 applies the predetermined direction of rotation. In some embodiments, the revaluation module 104 dynamically determines the direction of rotation by determining the rotation direction of the IQ trajectory immediately preceding the consecutive zero-value sample points. If the IQ trajectory has a counter-clockwise rotation, then the revaluation module 104 applies a counter-clockwise rotation when revaluing consecutive zero-value sample points. If the IQ trajectory has a clockwise rotation, then the revaluation module 104 applies a clockwise rotation when revaluing consecutive zero-value sample points.

The IQ trajectory translates in part to the phase response represented by the phase signal output from the polar converter 106. Ideally, the phase response includes smooth transitions. However, when distortion is introduced, such as when the IQ trajectory is at the origin, transients in the phase response are generated, which are manifested as irregular transitions in the phase signal input to the VCO 114. Such irregular transitions negatively impact the performance of the VCO 114, and therefore negatively impact the analog signal output from the modulation circuit 100. The revalued sampled IQ values resulting from revaluing the sampled IQ values at the origin serve to reduce such irregular transitions in the phase response, thereby improving the performance of the VCO and the output analog signal.

The VCO bandwidth is influenced by the trajectory of the sampled IQ values. The VCO bandwidth is also a function of the power amplifier distortion correction values at low amplitude events, such as the origin. For a positive correction value, a positive phase deviation is undesirable, while a negative phase deviation is desirable. For a negative correction value, a negative phase deviation is undesirable, while a positive phase deviation is desirable. Selective application of the direction of rotation during the revaluation method advantageously provides a negative phase deviation or positive phase deviation as desired. For IQ trajectories near the origin and generating large phase deviations, the trajectory is able to be modified as a function of the power amplifier distortion correction value. When the correction value is positive, the IQ trajectory should traverse clockwise from the origin. When the correction value is negative, the IQ trajectory should traverse counter-clockwise from the origin. This results in a smaller phase deviation when the correction value is added or subtracted. The VCO bandwidth is reduced, but the signal bandwidth at the power amplifier is not. The IQ trajectory is able to be changed at chip rate values and at mid-chip rate values, or at any over-sampled rate value. Without phase rotation as applied by the revaluation method, the VCO bandwidth can be adversely changed by power amplifier distortion.

In addition to providing an improved phase response, generating the revalued sampled IQ values as described above results in reducing the dynamic range of the power amplifier. Reducing the dynamic range is often a desired design consideration.

The present application has been described in terms of specific embodiments incorporating details to facilitate the understanding of the principles of construction and operation of the power amplification circuit. Many of the components shown and described in the various figures can be interchanged to achieve the results necessary, and this description should be read to encompass such interchange as well. As such, references herein to specific embodiments and details thereof are not intended to limit the scope of the claims appended hereto. It will be apparent to those skilled in the art that modifications can be made to the embodiments chosen for illustration without departing from the spirit and scope of the application.

What is claimed is:

1. A method comprising:
   a. sampling an input signal to generate a plurality of discrete sampled IQ values within an IQ domain, wherein each sampled IQ value includes an in-phase component and a quadrature component;
   b. for a first sampled IQ value at the origin, revaluing the first sampled IQ value to a first revalued sampled IQ value, wherein the first revalued sample IQ value is a non-origin IQ value;

c. for each consecutive sampled IQ value at the origin that immediately follows the first sampled IQ value, rotating the first revalued sampled IQ value about the origin, thereby forming a next revalued sampled IQ value such that each next revalued sampled IQ value is an immediately preceding revalued sample IQ value rotated about the origin; and modulating each sampled IQ value not originally at the origin and each revalued sampled IQ value, wherein a direction of rotation used to form each next revalued sampled IQ value is clockwise, thereby distributing more energy to a low frequency side of a carrier band than to a high frequency side.

2. The method of claim 1 wherein the non-origin IQ value is a predetermined value.

3. The method of claim 1 wherein the non-origin IQ value is a randomly selected value at least a predetermined radius away from the origin.

4. The method of claim 1 wherein a degree of rotation used to form each next revalued sampled IQ value is a predetermined amount.

5. The method of claim 1 wherein a degree of rotation used to form each next revalued sampled IQ value is 90 degrees.

6. The method of claim 1 wherein a degree of rotation used to form each next revalued sampled IQ value is a randomly selected amount.

7. The method of claim 1 wherein a degree of rotation used to form each next revalued sampled IQ value is constant.

8. The method of claim 1 wherein a degree of rotation used to form each next revalued sampled IQ value is independent for each revalued sampled IQ value.

9. The method of claim 1 wherein the non-origin IQ value is a predetermined value.

10. The method of claim 1 wherein the non-origin IQ value is a randomly selected value at least a predetermined radius away from the origin.

11. A method comprising:
a. sampling an input signal to generate a plurality of discrete sampled IQ values within an IQ domain, wherein each sampled IQ value includes an in-phase component and a quadrature component;
b. for a first sampled IQ value at the origin, revaluing the first sampled IQ value to a first revalued sampled IQ value, wherein the first revalued sample IQ value is a non-origin IQ value;
c. for each consecutive sampled IQ value at the origin that immediately follows the first sampled IQ value, rotating the first revalued sampled IQ value about the origin, thereby forming a next revalued sampled IQ value such that each next revalued sampled IQ value is an immediately preceding revalued sample IQ value rotated about the origin; and
d. modulating each sampled IQ value not originally at the origin and each revalued sampled IQ value,
wherein a direction of rotation used to form each next revalued sampled IQ value is counter-clockwise, thereby distributing more energy to a high frequency side of a carrier band than to a low frequency side.

12. The method of claim 11 wherein the non-origin IQ value is a predetermined value.

13. The method of claim 11 wherein the non-origin IQ value is a randomly selected value at least a predetermined radius away from the origin.

14. The method of claim 11 wherein a degree of rotation used to form each next revalued sampled IQ value is a predetermined amount.

15. The method of claim 11 wherein a degree of rotation used to form each next revalued sampled IQ value is 90 degrees.

16. The method of claim 11 wherein a degree of rotation used to form each next revalued sampled IQ value is a randomly selected amount.

17. The method of claim 11 wherein a degree of rotation used to form each next revalued sampled IQ value is constant.

18. The method of claim 11 wherein a degree of rotation used to form each next revalued sampled IQ value is independent for each revalued sampled IQ value.

19. A method comprising:
a. sampling an input signal to generate a plurality of discrete sampled IQ values within an IQ domain, wherein each sampled IQ value includes an in-phase component and a quadrature component;
b. for a first sampled IQ value at the origin, revaluing the first sampled IQ value to a first revalued sampled IQ value, wherein the first revalued sample IQ value is a non-origin IQ value;
c. for each consecutive sampled IQ value at the origin that immediately follows the first sampled IQ value, rotating the first revalued sampled IQ value about the origin, thereby forming a next revalued sampled IQ value such that each next revalued sampled IQ value is an immediately preceding revalued sample IQ value rotated about the origin; and
d. modulating each sampled IQ value not originally at the origin and each revalued sampled IQ value, and
wherein a direction of rotation used to form each next revalued sampled IQ value is determined according to a correction look-up table that includes a set of correction values, and if the correction look-up table includes a negative value corresponding to the origin, then the direction of rotation is counterclockwise.

20. A method comprising:
a. sampling an input signal to generate a plurality of discrete sampled IQ values within an IQ domain, wherein each sampled IQ value includes an in-phase component and a quadrature component;
b. for a first sampled IQ value at the origin, revaluing the first sampled IQ value to a first revalued sampled IQ value, wherein the first revalued sample IQ value is a non-origin IQ value;
c. for each consecutive sampled IQ value at the origin that immediately follows the first sampled IQ value, rotating the first revalued sampled IQ value about the origin, thereby forming a next revalued sampled IQ value such that each next revalued sampled IQ value is an immediately preceding revalued sample IQ value rotated about the origin; and
d. modulating each sampled IQ value not originally at the origin and each revalued sampled IQ value,
wherein a direction of rotation used to form each next revalued sampled IQ value is determined according to a correction look-up table that includes a set of correction values, and if the correction look-up table includes a positive value corresponding to the origin, then the direction of rotation is clockwise.

21. A method comprising:
a. sampling an input signal to generate a plurality of discrete sampled IQ values within an IQ domain, wherein each sampled IQ value includes an in-phase component and a quadrature component;

b. for a first sampled IQ value at the origin, revaluing the first sampled IQ value to a first revalued sampled IQ value, wherein the first revalued sample IQ value is a non-origin IQ value;

c. for each consecutive sampled IQ value at the origin that immediately follows the first sampled IQ value, rotating the first revalued sampled IQ value about the origin, thereby forming a next revalued sampled IQ value such that each next revalued sampled IQ value is an immediately preceding revalued sample IQ value rotated about the origin; and d. modulating each sampled IQ value not originally at the origin and each revalued sampled IQ value, wherein a direction of rotation used to form each next revalued sampled IQ value is dynamically determined according to a direction of rotation of an IQ trajectory immediately preceding the consecutively sampled IQ values at the origin.

* * * * *